United States Patent [19]
Spezio et al.

[11] Patent Number: 5,323,126
[45] Date of Patent: Jun. 21, 1994

[54] SELF-INITIALIZING CIRCUIT LINK

[75] Inventors: Anthony E. Spezio, Laurel; Saurabh Dalal, Lanham, both of Md.; Edward M. Alexander, Falls Church, Va.; Hal L. Levitt, Baltimore, Md.

[73] Assignee: The United States of America as represented by the Secretary of the Navy, Washington, D.C.

[21] Appl. No.: 83,776

[22] Filed: Jun. 30, 1993

[51] Int. Cl.$^5$ .............................. H01P 5/18
[52] U.S. Cl. .................. 333/109; 333/17.2; 333/202
[58] Field of Search .............. 333/109, 113, 115, 116, 333/14, 17.2, 156, 202

[56] References Cited

U.S. PATENT DOCUMENTS

| | | | |
|---|---|---|---|
| 3,058,070 | 10/1962 | Reingold et al. | 333/116 X |
| 3,058,071 | 10/1962 | Walsh et al. | 333/113 X |
| 4,595,889 | 6/1986 | Stitzer et al. | 333/17.2 |
| 4,951,008 | 8/1990 | Vedrenne et al. | 333/17.2 |
| 5,204,909 | 4/1993 | Cowan | 381/106 |

Primary Examiner—Paul Gensler
Attorney, Agent, or Firm—Thomas E. McDonnell; Edward F. Miles

[57] ABSTRACT

A circuit link, and method for using link, for self initializing any device operatively connected to the link. An input signal is split into two portions, one of which is delayed so that the undelayed signal can transverse the circuit link before the delayed signal. A pair of quadrature splitters are operatively connected to one another to split and combine the undelayed and delayed signals in their turns, and recombine them in their turns, in a manner effective to cause one of the circuit link's outputs to be nonzero responsive to the delayed signal, and zero responsive to the undelayed signal, with the opposite result on the other circuit output. The undelayed signal is thus available to initialize any device requiring initialization, and the delayed signal, unperturbed by any such device, is thus available for use as the circuit link's ultimate output. The circuit is especially useful with frequency selective limiters (FSL's), which are commonly used as channelizers in multichannel communication systems, and which are ineffective before initialization.

9 Claims, 1 Drawing Sheet

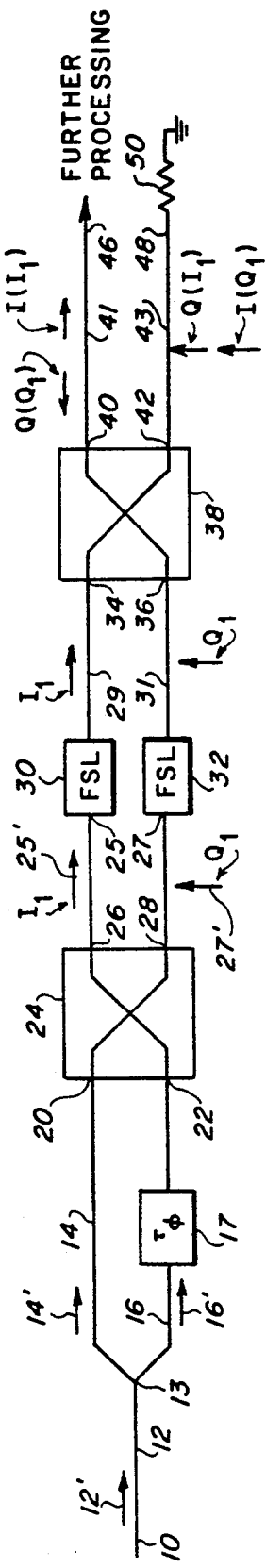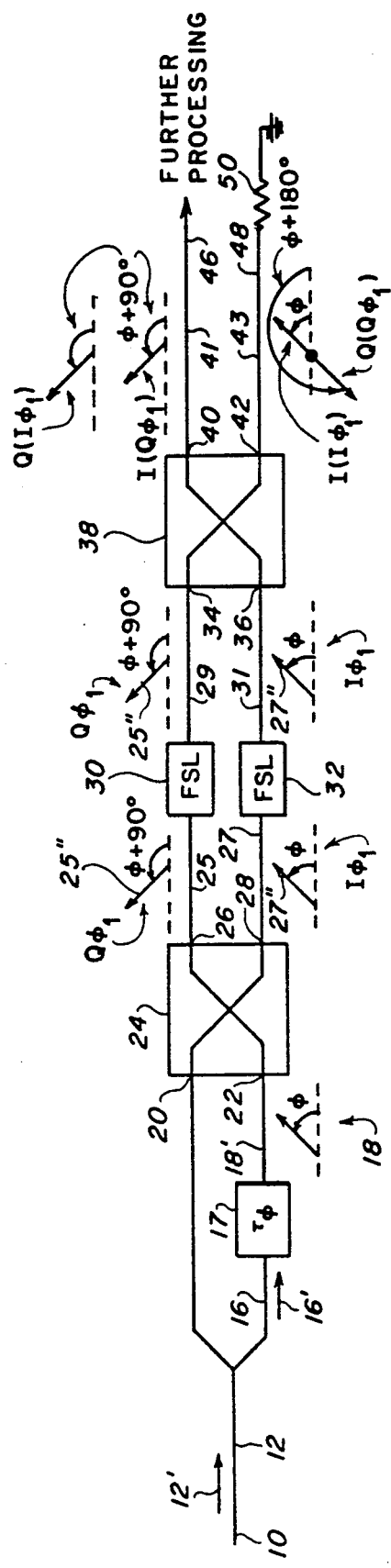
FIG. 1a
FIG. 1b

SELF-INITIALIZING CIRCUIT LINK

BACKGROUND OF THE INVENTION

Many classes of electromagnetic device require initialization. An example is the Frequency Selective Limiter (FSL), a magnetostrictive device which is used as an amplitude compressor in communication systems. Examples of FSL's appear in U.S. Pat. Nos. 4,595,889 and 4,845,439 to Stitzer et al. The FSL's dipole domains tend to spin synchronously with the frequency of signals input to the device, and when driven into a non-linear regime, the FSL dissipates energy into its substrate and thus reduces the amplitude of signal at that frequency. This causes the FSL to act as a narrow band notch filter about a specific resonant frequency, and some FSL's have quite narrow linewidths. This in turn makes them valuable as narrowband filters such as are needed for channelized communication systems, e.g. receivers for radio, television, cable television, electronic warfare command and control systems, etc. Further, the dipole domains saturate at a specific input power. This causes the FSL to attenuate a larger signal more strongly than a smaller one. Together, these two attributes have resulted in FSL's being used as amplitude compressors, i.e. devices that narrow the amplitude gap between larger undesired signals and smaller desired ones, permitting easier detection of the desired ones. (Or, more to the point, permitting detection of the smaller desired signal possible with less complicated and expensive hardware.)

FSL's have a significant drawback. In order to be effective, an FSL's dipole domains must "spin up," i.e. become energized from their relaxation state. Before spin up, the FSL is largely ineffective, nominally for a time of 100-300 ns. For simplicity, systems with FSL's typically use the leading edge of the input signal to spin up the FSL's dipole domains. This means that the energy in the leading edge of the input signal is transmitted unattenuated, and thus no compression in the output signal results. This is of little consequence for continuous wave communication systems. It is, however, of considerable consequence for digital systems, particularly those whose inter-pulse period is of the same order as the spin-up time, about $10^{-7}$ sec and above, or about 0.01 GHz and below. In the spin-up period, FSL spin-up can cause a significant loss of data. The preferred operating range of the FSL comprehends a large portion of the RF spectrum, generally 2-6 GHz.

SUMMARY OF THE INVENTION

Accordingly, an object of the invention is to provide a circuit and method of using the circuit which permits the simple, inexpensive, and reliable initialization of an electromagnetic device.

Another object is to use the input signal to initialize such a device.

Another object is to do the foregoing without loss of information on the input signal.

Another object is to do the foregoing for a FSL device by using the input signal to spin up the dipole domains of the device prior to processing of the input.

In accordance with these and other objects made apparent hereinafter, the invention concerns a circuit link, and method of using the circuit link, in which an input, such as a digital communication signal, is split into two parallel input signals. One of the two parallel signals is delayed with respect to the other. The circuit link has first and second quadrature splitters, which are operatively connected in the circuit so the two parallel signals traverse the first and then the second, in a manner that results in one output of the second quadrature splitter producing a replica of the input signal to the circuit link in response to the undelayed signal, and the other output producing zero signal, due to signal self cancellation. Conversely, responsive to the delayed signal, these output conditions are reversed.

As a result, one output of the circuit link will be zero for the undelayed signal, and will pass a replica of the circuit's input (i.e. same signature, but attenuated) for the delayed signal. This permits one to use the undelayed signal for initialization of any other devices operatively connected to the circuit link, without using, and most particularly without degrading, the delayed signal. By operatively connecting a pair of phase and amplitude tracking FSL's between the quadrature splitters, one can use the undelayed signal to spin up the FSL's dipole domains. By selecting the time delay to permit the undelayed signal to initialize the circuit link entirely before the delayed signal, and before the dipole domains relax, the circuit will act as a filter and amplitude compressor in accordance with the FSL's characteristics, without degrading information on the circuit link's output (i.e. the delayed signal).

These and other objects, features, and advantages of the invention are better understood from the following detailed description of particular embodiments of the invention. It is understood, however, that the invention is capable of extended application beyond the precise details of these embodiments. Changes and modifications can be made that do not affect the spirit of the invention, nor exceed its scope, as expressed in the appended claims. The embodiments are described with particular reference to the accompanying drawings, wherein:

BRIEF DESCRIPTION OF THE DRAWINGS

FIG. 1a is a circuit diagram showing an embodiment of the invention, as it processes the undelayed signal.

FIG. 1b shows the same circuit, as it processes the delayed signal.

DETAILED DESCRIPTION

With reference to the drawing figures, wherein like numbers indicate like parts throughout the several views, FIGS. 1a and 1b show a circuit link which receives an input signal 12 at line 10 having phase 12'. Phase 12' of input signal 12 is arbitrary, and is shown in the figures as a horizontal arrow for a convenient phase reference to simplify explanation of the circuit. A conventional splitter 13 splits the signal 12 into signal 14, 16 having respective phases 14' and 16' substantially identical to phase 12'. Time delay 17 delays signal 16 by a preselected amount, so that the signal exiting delay 17 has a phase lag $\phi$ with respect to phase 14' of signal 14.

FIG. 1a shows in detail the processing of signal 14. Signal 14 enters first input 20 of a first quadrature splitter 24. Splitter 24 has respective first and second inputs 20, 22, and respective first and second outputs 26, 28. Any signal at first input 20 is split into two −3db components, one inphase with the signal at input 20, the other in quadrature, i.e. 90° out of phase with the signal at input 20. The inphase signal exits from output 26, and the quadrature signal exits from output 28. Similarly, any signal at second input 22 is also split into two −3db components, one inphase with the signal at input 22, the other in quadrature, i.e. 90°. out of phase with the signal at input 22. The signal inphase with the signal at 22 exits from output 28, and the signal in quadrature with the signal at 22 exits from output 26.

Accordingly, then, undelayed signal 14 is split into inphase and quadrature signals on lines 25 and 27, having phases 25' and 27', respectively, 25' being in phase with input 12, and 27' being at 90° phase. For convenience, these signals are referred to as $I_1$ and $Q_1$, to refer to the inphase and quadrature outputs respectively of the first quadrature splitter. $I_1$ and $Q_1$ enter respective FSL's 30 and 32, where they spin up the dipole domains of the FSL's, and exit onto respective lines 29, 31 and enter respective first and second inputs 34, 36 to second quadrature splitter 38. Splitter 38 is identical to splitter 24. Accordingly, splitter 38 splits $I_1$, sending its inphase component to output 40 (where it is identified as $I(I_1)$, indicating the inphase component of $I_1$), and its quadrature component to output 42 and output line 43 (where it is identified as $Q(I_1)$, indicating the quadrature component of $I_1$). Splitter 38 sends the inphase component of $Q_1$ to output 42 (where it is identified as $I(Q_1)$, indicating the inphase component of $Q_1$), and its quadrature component to output 40 and output line 41 (where it is identified as $Q(Q_1)$, indicating the quadrature component of $Q_1$).

From the foregoing, and as can be seen in FIG. 1a, the output at 40 consists of $Q(Q_1)$ plus $I(I_1)$, which are 180° out of phase. Because the splitters 24, 38 are identical, and because the FSL's are identical and provide no relative phase shift, these signals are of equal amplitude and opposite phase, and cancel one another, leaving output 46 zero. Conversely, the signal at second output 42 consists of $Q(I_1)$ plus $I(Q_1)$, which are of equal amplitude and the same phase, and thus add phase coherently.

The significance of this is best understood in conjunction with a description of how the circuit processes the signal 18', as illustrated in FIG. 1b. The delayed signal 16' in line 16 enters delay 17, which causes signal 16' to be delayed such that it acquires an arbitrary phase $\phi$ (indicated at 18) with respect to signals 12', 16', and enters input 22 of quadrature coupler 24 as delayed signal 18'. Splitter splits signal 18' into inphase and quadrature components, and directs the inphase component 27", denominated $I_{\phi 1}$, to output 28, and quadrature component 25", denominated $Q_{\phi 1}$ to output 26. As is seen in FIG. 1b, $I_{\phi 1}$ is out of phase with input 12 by $\phi$, $Q_{\phi 1}$ by $\phi + 90°$. $Q_{\phi 1}$ and $I_{\phi 1}$ traverse lines 25 and 27 respectively to respective FSL's, which being already spun up by signal 14' pass attenuated (and otherwise unaffected) to respective lines 29 and 31, and thence respectively to first and second inputs 34, 36 of second quadrature splitter 38. Input signal $Q_{\phi 1}$ to first input 34 is split into an inphase component $I(Q_{\phi 1})$, which exits from first output 40, and quadrature component $Q(Q_{\phi 1})$ exits from second output 42. Similarly, signal $I_{\phi 1}$ enters second input 36 of splitter 38, and is split into inphase component $I(I_{\phi 1})$, which exits from second output 42, and quadrature component $Q(I_{\phi 1})$, which exits from output 40.

From the foregoing, and as is seen in FIG. 1b, the signal exiting first output 40 of quadrature splitter 38 is $Q(I_{\phi 1})$ plus $I(Q_{\phi 1})$, which both have phases of $\phi + 90°$ with respect to input 12, and thus sum in phase and reinforce one another. The signal at second output 42 is $I(I_{\phi 1})$ plus $Q(Q_{\phi 1})$, which are out of phase by 180° (have respective phases of $\phi$ and $\pi + \phi$ with respect of input 12), and thus cancel one another.

Thus responsive to undelayed signal 14, the circuit of FIGS. 1a, 1b produces a zero output at 46, and an output at 48 that is a replica of input signal 12, degraded by the energy needed to spin up the dipole domains of FSL's 30, 32. Conversely the output of the circuit responsive to delayed signal 16 produces a zero output at 48, and a nonzero output at 46, which, because undelayed signal 14 had already spun up the dipole domains of FSL's 30, 32, is a faithful replica of (has the same signature as) input 12. Line 46 is thus the natural ultimate output of the circuit of FIGS. 1a, 1b, because it is zero in the presence of the degraded (undelayed) signal, and nonzero in the presence of the undegraded (delayed) signal. Because the conditions on circuit line 48 are opposite, the signal exiting there is preferably discarded, for example by directing it to ohmic termination 50.

Quadrature splitters 34, 38 can be any appropriate known device, and preferably are matched quadrature hybrid couplers, which are well known, simple to use, inexpensive, and reliable. The FSL's preferably are of the conventional microstrip kind, in which the dielectric is YIG (yttrium iron garnet), because YIG FSL's are well known, adaptable to a wide variety of applications, and have relatively high microwave resonant frequencies and narrow linewidths, which can be controllably lowered by appropriate doping to provide the user with additional flexibility.

The invention has been described in what is considered to be the most practical and preferred embodiments. It is recognized, however, that obvious modifications to these embodiments may occur to those with skill in this art. Accordingly, the scope of the invention is to be discerned solely by reference to the appended claims, wherein:

We claim:

1. A circuit link, comprising:
   input means for receiving an input signal to said circuit link and splitting said input signal into two parallel input signals;
   delay means for delaying one of said two parallel input signals with respect to the other by a preselected amount;
   first and second quadrature splitters, each of said quadrature splitters comprising first and second inputs and first and second outputs, said each of said quadrature splitters further comprising:
   means for splitting an input signal to said first input into respective inphase and quadrature components $I_1$ and $Q_1$, and outputting said $I_1$ from said first output, and outputting said $Q_1$ from said second output; and
   means for splitting an input signal to said second input into respective inphase and quadrature components $I_2$ and $Q_2$, and outputting said $I_2$ from said second output, and outputting said $Q_2$ from said first output;
   said circuit link further comprising:
   means for inputting said one of said two parallel signals to said second input of said first quadrature splitter, and for inputting said other of said two parallel signals to said first input of said first quadrature splitter;
   means for directing said first output of said first quadrature splitter to said first input of said second quadrature splitter, and for directing said second output of said first quadrature splitter to said second input of said second quadrature splitter.

2. The circuit link of claim 1, wherein:

said means for directing comprises first and second circuit lines, said first circuit line being operatively connected between said first output of said first quadrature splitter and said first input of said second quadrature splitter, said second circuit line being operatively connected between said second output of said first quadrature splitter and said second input of said second quadrature splitter; and said circuit link further comprises first and second frequency selective limiters; one each of said limiters being disposed in a respective one of said first and said second circuit lines.

3. The circuit link of claim 2, wherein each of said limiters is phase and amplitude matched with respect to the other said limiter.

4. The circuit link of claim 2, wherein each of said limiters has substantially the same resonance frequency, and has substantially the same impedance at said resonance frequency.

5. The circuit link of claim 4, wherein one or both of said limiters is doped effective to have said same resonance frequency, and have said same impedance.

6. A method of signal processing, said method using a circuit link, said circuit link comprising:

first and second quadrature splitters, each of said quadrature splitters comprising first and second inputs and first and second outputs, said each of said quadrature splitters further comprising:

means for splitting an input signal to said first input into respective inphase and quadrature components $I_1$ and $Q_1$, and outputting said $I_1$ from said first output, and outputting said $Q_1$ from said second output; and means for splitting an input signal to said second input into respective inphase and quadrature components $I_2$ and $Q_2$, and outputting said $I_2$ from said second output, and outputting said $Q_2$ from said first output;

said method comprising steps for:

receiving an input signal to said circuit link and splitting said input signal to said circuit link into two parallel input signals;

delaying one of said two parallel input signals with respect to the other by a preselected amount;

directing said one of said two parallel signals to said second input of said first quadrature splitter;

directing said other of said two parallel signals to said first input of said first quadrature splitter;

directing said first output of said first quadrature splitter to said first input of said second quadrature splitter; and directing said second output of said first quadrature splitter to said second input of said second quadrature splitter.

7. The method of claim 6, wherein said step for directing said first output of said first quadrature splitter to said first input of said second quadrature splitter comprises operatively disposing a first frequency selective limiter between said first output of said first quadrature splitter and said first input of said second quadrature splitter; and said step for directing further comprises disposing a second frequency selective limiter between said second output of said first quadrature splitter and said second input of said second quadrature splitter.

8. The method of claim 7, further comprising a step for causing both said limiters to have substantially the same resonance frequency, and substantially the same impedance at said frequency.

9. The method of claim 8, wherein said step for causing both said limiters to have substantially the same resonance frequency, and substantially the same impedance at said frequency, is a step for doping one or both of said first and second frequency selective limiters effective to cause said limiters to have said resonance frequency and said impedance at said frequency.

* * * * *